(12) United States Patent
Kim

(10) Patent No.: US 8,581,654 B2
(45) Date of Patent: Nov. 12, 2013

(54) METHOD OF COMPENSATING CLOCK SKEW, CLOCK SKEW COMPENSATING CIRCUIT FOR REALIZING THE METHOD, AND INPUT/OUTPUT SYSTEM INCLUDING THE CLOCK SKEW COMPENSATING CIRCUIT

(75) Inventor: Hee-dong Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 203 days.

(21) Appl. No.: 13/171,994

(22) Filed: Jun. 29, 2011

(65) Prior Publication Data

US 2011/0316589 A1 Dec. 29, 2011

(30) Foreign Application Priority Data

Jun. 29, 2010 (KR) ........................ 10-2010-0062081

(51) Int. Cl.
*H03K 3/00* (2006.01)
(52) U.S. Cl.
USPC ........................................ 327/293; 327/291
(58) Field of Classification Search
USPC ........................ 327/291, 293, 261, 108, 112
See application file for complete search history.

(56) References Cited

U.S. PATENT DOCUMENTS

| 6,031,886 | A  | * | 2/2000 | Nah et al. ........................ 375/375 |
| 7,746,142 | B2 | * | 6/2010 | Changchein et al. ......... 327/291 |
| 7,956,664 | B2 | * | 6/2011 | Chueh et al. .................. 327/293 |
| 8,040,160 | B2 | * | 10/2011 | Avalur .......................... 327/108 |
| 8,159,274 | B2 | * | 4/2012 | Lin et al. ...................... 327/108 |

FOREIGN PATENT DOCUMENTS

| JP | 2002-044061 | 2/2002 |
| JP | 2009-044579 | 2/2009 |
| KR | 1020050061892 | 6/2005 |

* cited by examiner

*Primary Examiner* — Hai L Nguyen
(74) *Attorney, Agent, or Firm* — F. Chau & Associates, LLC

(57) ABSTRACT

A method of compensating clock skew may include generating (2M+1) detected values by applying (2M+1) delay clock signals to (2M+1) pieces of delay data, wherein M is a natural number, determining a dominant logic value based on a comparison of a number of logic high detected values and a number of logic low detected values from among the (2M+1) detected values, determining a median delay time based on a number of the (2M+1) detected values having the dominant logic value, and adjusting a phase of a clock signal using the median delay time.

20 Claims, 5 Drawing Sheets

FIG. 2

| CASE | 1 | 2 | 3 | 4 | 5 | 6 | 7 | 8 | 9 | 10 |
|---|---|---|---|---|---|---|---|---|---|---|
| PHASE 1 | 1 | 0 | 0 | 0 | 0 | 0 | 0 | 0 | 0 | 0 |
| PHASE 2 | 1 | 1 | 0 | 0 | 0 | 0 | 0 | 0 | 0 | 0 |
| PHASE 3 | 1 | 1 | 1 | 0 | 0 | 0 | 0 | 0 | 0 | 0 |
| PHASE 4 | 1 | 1 | 1 | 1 | 0 | 0 | 0 | 0 | 0 | 0 |
| PHASE 5 | 1 | 1 | 1 | 1 | 1 | 0 | 0 | 0 | 0 | 0 |
| PHASE 6 | 1 | 1 | 1 | 1 | 1 | 1 | 0 | 0 | 0 | 0 |
| PHASE 7 | 1 | 1 | 1 | 1 | 1 | 1 | 1 | 0 | 0 | 0 |
| PHASE 8 | 1 | 1 | 1 | 1 | 1 | 1 | 1 | 1 | 0 | 0 |
| PHASE 9 | 1 | 1 | 1 | 1 | 1 | 1 | 1 | 1 | 1 | 0 |

METHOD OF COMPENSATING CLOCK SKEW, CLOCK SKEW COMPENSATING CIRCUIT FOR REALIZING THE METHOD, AND INPUT/OUTPUT SYSTEM INCLUDING THE CLOCK SKEW COMPENSATING CIRCUIT

CROSS-REFERENCE TO RELATED APPLICATIONS

This application claims priority under 35 U.S.C. § 119 to Korean Patent Application No. 10-2010-0062081, filed on Jun. 29, 2010, the disclosure of which is incorporated by reference herein in its entirety.

BACKGROUND

Exemplary embodiments of the present inventive concept relate to a system and method of compensating a clock skew, and more particularly, to a system and method of compensating a clock skew in real-time.

A clock used for recognizing data is generally optimized through a predetermined training process while a system is being initialized. However, a change in the surrounding environment due to factors including, for example, heat generated during the operation of the system, may result in clock skew. Further, the patterns of data input and output during actual operation of the system may differ from a particular data pattern tested during the training operation. Thus, even if a clock is initially optimized during a training operation, the clock may not be optimized during the actual operation of the system. For example, although clock skew may be minimized during the training process of a system, clock skew may still occur during actual operation of the system.

SUMMARY

Exemplary embodiments of the present inventive concept include a method of compensating a clock skew for adjusting the phase of a clock signal during operation of a system, a clock skew compensating circuit for adjusting the phase of a clock signal during operation of a system, and an input/output system including a clock skew compensating circuit for adjusting the phase of a clock signal during operation of the system.

According to an exemplary embodiment of the inventive concept, a method of compensating a clock skew includes generating (2M+1) detected values by applying (2M+1) delay clock signals to (2M+1) pieces of delay data, wherein M is a natural number, determining a dominant logic value based on a comparison of a number of logic high detected values and a number of logic low detected values from among the (2M+1) detected values, determining a median delay time based on a number of the (2M+1) detected values having the dominant logic value, and adjusting a phase of a clock signal using the median delay time.

According to an exemplary embodiment of the inventive concept, a clock skew compensating circuit includes a data delaying unit, a clock delaying unit, a data detecting unit, and a comparing/selecting unit. The data delaying unit is configured to generate (2M+1) pieces of delay data by delaying a phase of received data by a period of time N, wherein the (2M+1) pieces of delay data have a same phase, N is a predetermined period of time, and M is a natural number. The clock delaying unit is configured to generate (2M+1) delay clock signals by delaying a clock signal having a period T by delay times including periods of time (N±mΔ), wherein m is a natural number greater than or equal to 1 and less than or equal to M, and Δ is a unit delay time greater than or equal to 0 and less than or equal to T/(2M). The data detecting unit is configured to generate (2M+1) pieces of output data by applying the (2M+1) delay clock signals to the (2M+1) pieces of delay data. The comparing/selecting unit is configured to compare logic values of the (2M+1) pieces of output data and generate a clock skew control signal to control a skew of the clock signal and detected data.

According to an exemplary embodiment of the inventive concept, an input/output system includes a buffer, a delay circuit, a skew compensating circuit, and a selecting unit. The buffer is configured to generate normally detected data by applying a compensated clock signal having a period T to received data. The delay circuit is configured to generate (2M+1) pieces of delay data by delaying the received data by a period of time N, generate (2M+1) pieces of output data by applying (2M+1) delay clock signals generated by delaying the compensated clock signal by periods of time (N±mΔ) to the (2M+1) pieces of delay data, compare logic values of the (2M+1) pieces of output data, generate compensated detected data having a logic value corresponding to a dominant logic number of the (2M+1) pieces of output data, and generate an adjusting signal for adjusting a phase of the compensated clock signal. M is a natural number, N is a predetermined period of time, m is a natural number greater than or equal to 1 and less than or equal to M, and Δ is a unit delay time greater than or equal to 0 and less than or equal to T/(2M). The skew compensating circuit is configured to generate the compensated clock signal by adjusting a phase of a received clock signal in response to the adjusting signal. The selecting unit is configured to select one of the normally detected data and the compensated detected data, and output the selected data in response to a clock skew control signal.

According to an exemplary embodiment of the inventive concept, a method of compensating a clock skew includes generating (2M+1) pieces of delay data by delaying received data by a predetermined default delay time, wherein M is a natural number, generating (2M+1) delay clock signals by delaying a clock signal by a plurality of delay times including the default delay time, generating (2M+1) detected values by applying the (2M+1) delay clock signals to the (2M+1) pieces of delay data, and adjusting a phase of the clock signal using the (2M+1) detected values.

BRIEF DESCRIPTION OF THE DRAWINGS

The above and other features of the present inventive concept will become more apparent by describing in detail exemplary embodiments thereof with reference to the accompanying drawings, in which:

FIG. 2 is a phase compensation table used for the adjustment of the phase of a clock signal in a method of compensating a clock skew, according to an exemplary embodiment of the inventive concept;

DETAILED DESCRIPTION

Figure 1:
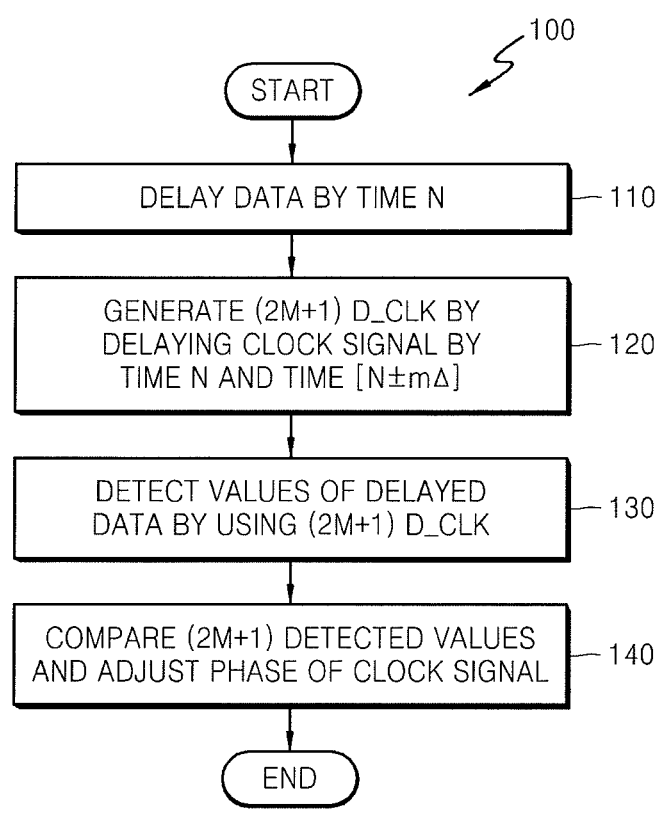
FIG. 1 is a flowchart of a method of compensating a clock skew, according to an exemplary embodiment of the inventive concept.

Exemplary embodiments of the present inventive concept will be described more fully hereinafter with reference to the accompanying drawings. Like reference numerals may refer to like elements throughout the accompanying drawings.

Exemplary embodiments of the inventive concept allow for real-time adjustment of inconsistencies of a clock signal and data, which may vary as a surrounding environment is changed after a system is initialized. Such a real-time adjustment may be made by, for example:

1. generating a plurality of pieces of equal delay data by delaying the data for a preset default delay time, 2. generating a delay clock signal by delaying the clock signal for the preset default delay time, generating a plurality of delay clock signals by delaying the clock signal for periods of time shorter than the preset default delay time, and generating a plurality of delay clock signals by delaying the clock signal for periods of time longer than the preset default delay time, 3. detecting values of the plurality of pieces of delay data using the plurality of delay clock signals and generating detected values, and 4. adjusting the phase of the clock signal based on a distribution of the detected values.

FIG. 1 is a flowchart of a method of compensating a clock skew, according to an exemplary embodiment of the inventive concept.

Referring to FIG. 1, the method of compensating a clock skew according to an exemplary embodiment includes generating delay data (operation 110), generating delay clock signals (operation 120), detecting values of the delay data (operation 130), and adjusting the phase of a clock signal CLOCK (operation 140).

In the operation 110, a plurality of pieces of delay data are generated by delaying received data DATA for a period of time N (e.g., the default delay time). The plurality of pieces of delay data are delayed by the same period of time, and thus the plurality of pieces of delay data have the same phase. Here, the period of time N may be a predetermined time. For example, the period of time N may have a value acquired by multiplying a period T of the clock signal CLOCK by an integer (e.g., the period of time N may be 3 T), or the period of time N may be a random number unrelated to the period T. The period of time N may be referred to hereinafter as the default delay time.

In the operation 120, (2M+1) delay clock signals D_CLK are generated by delaying a received clock signal CLOCK by the period of time N and periods of time (N±MΔ). Here, M is a natural number (e.g., 1, 2, 3, . . . , M), and Δ (unit delay time) may be, for example, a period of time greater than or equal to 0 and smaller than 1/(2M) of the period T of the clock signal CLOCK (e.g., when Δ is 0, the received clock signal CLOCK is delayed by the period of time N). According to an exemplary embodiment, when detecting values of data from all edges of the clock signal CLOCK (e.g., both the incremental edge and the decremental edge), the unit delay time Δ may be set to a period of time equal to 1/(4M) of the period T of the clock signal CLOCK. Hereinafter, (N±MΔ) may be referred to as delay times. According to an exemplary embodiment of the inventive concept, the default delay time (e.g., the period of time N) may be set to a period of time equal to the unit delay time Δ multiplied by (M+1).

In the operation 130, values of the delay data are detected using each of the (2M+1) delay clock signals, and (2M+1) detected values are generated. Each of the delay clock signals may be delayed by the unit delay time Δ. Therefore, if a first value detected using delay clock signals delayed by a period of time (N−MΔ) and a second value detected using delay clock signals delayed by a period of time (N+MΔ) are different from each other, values detected using delay clock signals delayed by delay times between the period of time (N−MΔ) and another period of time between the period of time (N−MΔ) and the period of time (N+MΔ) (e.g., a period of time (N−tΔ)) will be the same as the first value. Values detected using delay clock signals delayed by delay times between the period of time (N−tΔ) and the period of time (N+MΔ) will be same as the second value.

In the operation 140, the phase of the clock signal CLOCK is adjusted using the (2M+1) detected values generated in the operation 130. Although not shown in FIG. 1, the operation 140 may compare a number of logic high detected values and a number of logic low detected values from among the (2M+1) detected values. Further, the operation 140 may adjust the phase of the clock signal CLOCK using the delay times applied to the delay clock signals that are used for detecting the detected values having a logic value corresponding to the dominant number of the detected values, as determined in the above comparison.

Operation 140 is described in more detail below.

For convenience of explanation, it is assumed that M is 4 when referring to FIG. 2. Thus, in FIG. 2, there are 9 delay clock signals having phases different from each other.

FIG. 2 is a phase compensation table used for the adjustment of the phase of a clock signal in a method of compensating a clock skew, according to an exemplary embodiment of the inventive concept.

Referring to FIG. 2, phases PHASE 1 through PHASE 9 of nine delay clock signals are shown. A delay clock signal corresponding to the fifth phase PHASE 5 is a signal equivalent to the clock signal CLOCK delayed by the default delay time (e.g., the period of time N). The default delay time is equivalent to a period of time by which data is delayed to generate delay data.

A delay clock signal corresponding to the fourth phase PHASE 4 is a signal equivalent to the clock signal CLOCK delayed by a period of time that is a unit delay time Δ shorter than the default delay time (e.g., a period of time (N−Δ)). Further, a delay clock signal corresponding to the third phase PHASE 3 is a signal equivalent to the clock signal CLOCK delayed by a period of time (N−2Δ), a delay clock signal corresponding to the second phase PHASE 2 is a signal equivalent to the clock signal CLOCK delayed by a period of time (N−3Δ), and a delay clock signal corresponding to the first phase PHASE 1 is a signal equivalent to the clock signal CLOCK delayed by a period of time (N−4Δ).

A delay clock signal corresponding to the sixth phase PHASE 6 is a signal equivalent to the clock signal CLOCK delayed by a period of time that is a unit delay time Δ longer than the default delay time (e.g., a period of time (N+Δ)). Further, a delay clock signal corresponding to the seventh phase PHASE 7 is a signal equivalent to the clock signal CLOCK delayed by a period of time (N+2Δ), a delay clock signal corresponding to the eighth phase PHASE 8 is a signal equivalent to the clock signal CLOCK delayed by a period of time (N+3Δ), and a delay clock signal corresponding to the ninth phase PHASE 9 is a signal equivalent to the clock signal CLOCK delayed by a period of time (N+4Δ).

Therefore, from among first through ninth phases PHASE 1 through PHASE 9 of the 9 delay clock signals, first through fourth phases PHASE 1 through PHASE 4 are faster than a fifth phase PHASE 5, and sixth through ninth phases PHASE 6 through PHASE 9 are slower than the fifth phase PHASE 5. In addition, the first phase PHASE 1 is the fastest phase, the ninth phase PHASE 9 is the slowest phase, and phases between PHASE 1 and PHASE 9 gradually become slower from the second PHASE 2 to the eighth phase PHASE 8.

In FIG. 2, there may be 10 cases, CASE 1 through CASE 10.

A first case CASE 1 refers to a case in which logic high values (1) are detected in all of the phases PHASE 1 through PHASE 9, and a second case CASE 2 refers to a case in which a logic low value (0) is detected in the first phase PHASE 1 and logic high values (1) are detected in the remaining phases PHASE 2 through PHASE 9. Further, the number of logic low values (0) detected increases from a third case CASE 3 to a tenth case CASE 10. For example, 2 through 9 logic low values (0) are detected in the third through tenth cases CASE 3 through CASE 10, respectively. The tenth case CASE 10 refers to a case in which all detected logic values of data are logic low values (0). The number of logic high values (1) is greater than the number of logic low values (0) in the first through fifth cases CASE 1 through CASE 5, whereas the number of logic low values (0) is greater than the number of logic high values (1) in the sixth through tenth cases CASE 6 through CASE 10. The logic high value (1) and the logic low value (0) are used merely for exemplary purposes, and the inventive concept may be applied to cases in which the logic high value (1) and the logic low value (0) are reversed.

In the first case CASE 1, there are 9 logic high values (1), and from among phases PHASE 1 through PHASE 9 having logic high values (1), the median phase is the fifth phase PHASE 5. Therefore, in CASE 1, a delay clock signal having the fifth phase PHASE 5 will be the optimal delay clock signal. In this case, it is not necessary to adjust a phase of the current clock signal CLOCK, since there is no skew between data and a clock signal.

In the second case CASE 2, since there are 8 logic high values (1) and 1 logic low value (0), logic high values (1) dominate. Accordingly, either the fifth phase PHASE 5 or the sixth phase PHASE 6 is the median phase from among phases PHASE 2 through PHASE 9 having a logic high value (1). Although either of these phases may be selected as the median phase, and thus, be considered as an optimal signal, it is not necessary to adjust the phase of the current clock signal CLOCK when the fifth phase PHASE 5 is selected as the median phase having a logic high value.

In the third case CASE 3, since there are 7 logic high values (1) and 2 logic low values (0), the logic high values dominate and the sixth phase PHASE 6 is the median phase from among the phases PHASE 3 through PHASE 9 having logic high values (1). Therefore, a delay clock signal having the sixth phase PHASE 6 may be determined as the optimal delay clock signal. Therefore, a clock skew may be minimized by delaying the phase of the clock signal CLOCK by the unit delay time Δ.

The sixth phase PHASE 6 is the median phase having a logic high value in the fourth case CASE 4, and the seventh phase PHASE 7 is the median phase having a logic high value in the fifth case CASE 5. Therefore, clock skew may be minimized by delaying the phase of the clock signal CLOCK by the unit delay time Δ in the fourth case CASE 4, and by delaying the phase of the clock signal CLOCK by 2Δ in the fifth case CASE 5.

In the sixth through tenth cases CASE 6 through CASE 10, logic low values (0) dominate, and the same method applied to the first through fifth cases CASE 1 through CASE 5, in which logic high values (1) dominate, may also be applied to the sixth through tenth cases CASE 6 through CASE 10. For example, the third phase PHASE 3 is the median phase having a logic low value in the sixth case CASE 6 and the seventh case CASE 7, the fourth phase PHASE 4 is the median phase having a logic low value in the eighth case CASE 8, and the fifth phase PHASE 5 is the median phase having a logic low value in the ninth case CASE 9 and the tenth case CASE 10. Therefore, in the sixth case CASE 6 and the seventh case CASE 7, clock skew may be minimized by accelerating the phase of the clock signal by 2Δ. In the eighth case CASE 8, clock skew may be minimized by accelerating the phase of the clock signal by Δ. In the ninth case CASE 9 and the tenth case CASE 10, the clock signal CLOCK is not adjusted, similar to the first case CASE 1 and the second case CASE 2.

The median phases with respect to each of the cases CASE 1 through CASE 10 are shaded in FIG. 2.

According to an exemplary embodiment, the method of compensating for a clock skew shown in FIG. 1 may be performed in real-time without a separate training operation. Further, the method may be applied after a system is initialized and the phase of a clock signal is initially set. For example, the method may be automatically performed at a predetermined interval while the system is being operated, or it may be performed in response to predetermined control signals output by a main control device.

Figure 3:
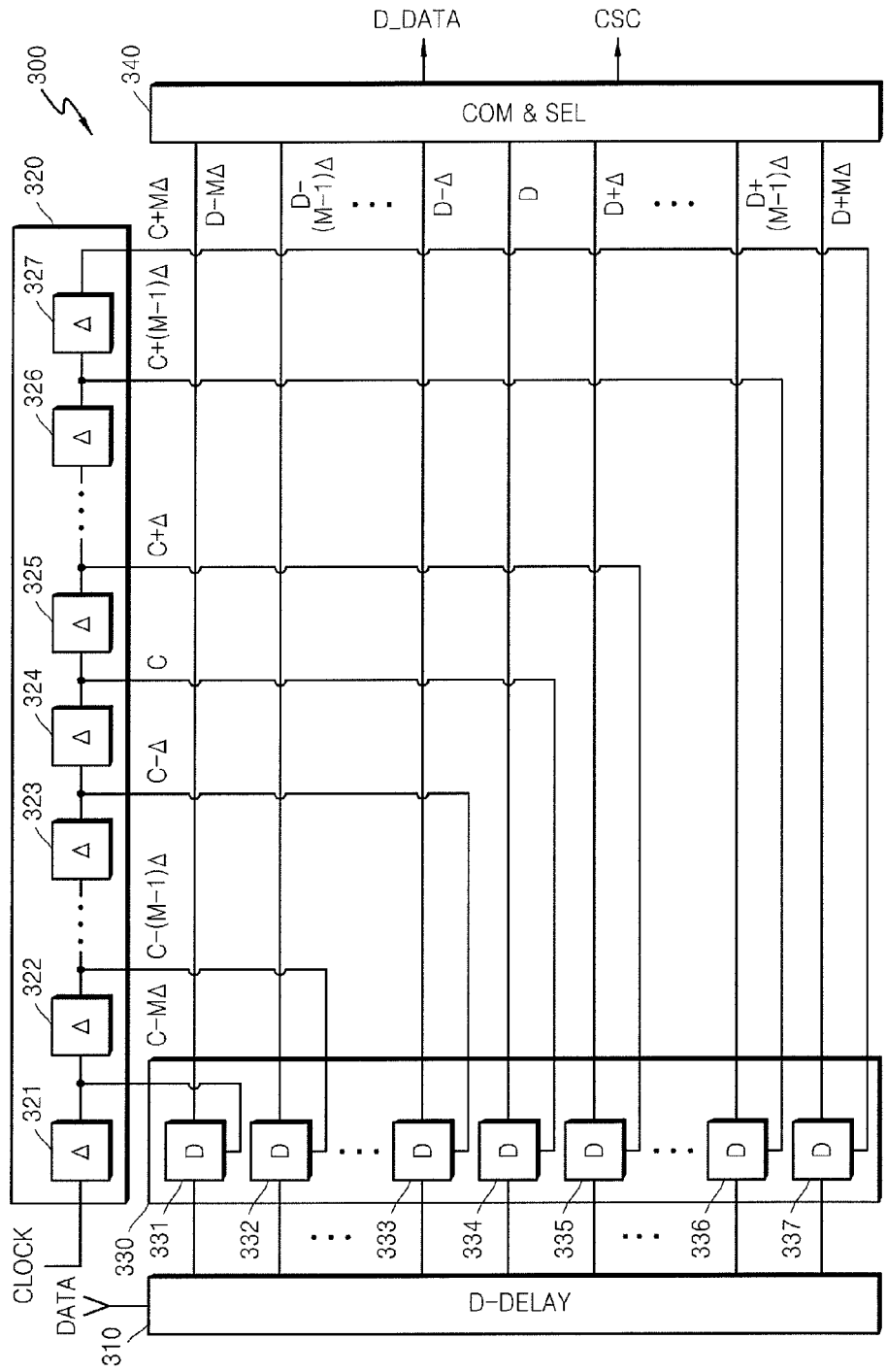
FIG. 3 is a block diagram of a clock skew compensating circuit, according to an exemplary embodiment of the inventive concept.

FIG. 3 is a block diagram of a clock skew compensating circuit 300, according to an exemplary embodiment of the inventive concept.

Referring to FIG. 3, the clock skew compensating circuit 300 according to an exemplary embodiment includes a data delaying unit 310, a clock delaying unit 320, a data detecting unit 330, and a comparing/selecting unit 340.

The data delaying unit 310 receives data DATA and generates pieces of delayed data D-DELAY that are delayed by the period of time N (e.g., the default delay time). The number of pieces of the delay data D-DELAY may be (2M+1). In this case, phases of the (2M+1) pieces of delay data D-DELAY are the same.

Figure 4:
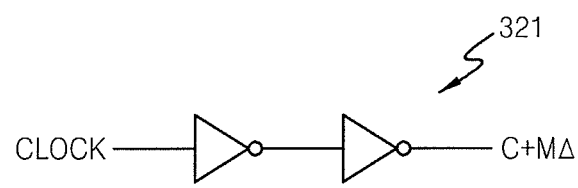
FIG. 4 shows the internal circuits of delaying units included in the clock delaying unit shown in FIG. 3, according to an exemplary embodiment of the inventive concept.

The clock delaying unit 320 receives the clock signal CLOCK having the period T and generates (2M+1) delay clock signals C−MΔ, C−(M−1)Δ, . . . , C−Δ, C, C+Δ, . . . , C+(M−1)Δ, and C+MΔ by delaying the clock signal CLOCK by the period of time N and periods of time (N±mΔ) (e.g., (N±Δ), (N±2Δ), . . . , (N±MΔ)). Here, m is a natural number from 1 to M. To generate the (2M+1) delay clock signals C−MΔ, C−(M−1)Δ, . . . , C−Δ, C, C+Δ, . . . , C+(M−1)Δ, and C+MΔ, the clock delaying unit 320 may include (2M+1) delaying units 321 through 327 that are connected in series to generate the (2M+1) delay clock signals C−MΔ, C−(M−1)Δ, C−ΔA, C, C+Δ, . . . , C+(M−1)Δ, and C+MΔ. The (2M+1) delaying units 321 through 327 may each be a buffer having two inverters connected to each other, as shown in FIG. 4. However, the delaying units 321-327 are not limited thereto. FIG. 4 shows the internal circuits of the delaying units 321 through 327, according to an exemplary embodiment of the inventive concept. Here, the default delay time (e.g., the period of time N) may be equal to the default delay time Δ multiplied by (M+1).

The delay clock signal C is generated by delaying the clock signal CLOCK by the default delay time (e.g., the period of time N). Delay clock signals C−MΔ, C−(M−1)Δ, ..., and C−Δ are generated by delaying the clock signal CLOCK by periods of time from the period of time (N−MΔ) to the period of time (N−Δ). That is, delay clock signals C−MΔ, C−(M−1)Δ, ..., and C−Δ are generated by delaying the clock signal CLOCK by periods of time shorter than the default delay time (e.g., the period of time N). Delay clock signals C+Δ, ..., C+(M−1)Δ, and C+MΔ are generated by delaying the clock signal CLOCK by periods of time from the period of time (N+Δ) to the period of time (N+MΔ). That is, delay clock signals C+Δ, ..., C+(M−1)Δ, and C+MΔ are generated by delaying the clock signal CLOCK for periods of time longer than the default delay time (e.g., the period of time N).

As a result, the delay clock signals C−MΔ, C−(M−1)Δ, ..., and C−Δ have faster phases than the delay clock signal C, and the delay clock signals C+Δ, ..., C+(M−1)Δ, and C+MΔ have slower phases than the delay clock signal C.

Figure 5:
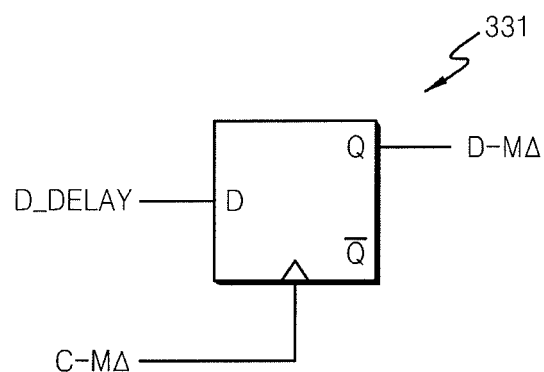
FIG. 5 shows a D-type flip-flop used for the data detecting unit shown in FIG. 3, according to an exemplary embodiment of the inventive concept.

The data detecting unit 330 receives the (2M+1) pieces of delay data D-DELAY and the (2M+1) delay clock signals C−MΔ, C−(M−1)Δ, ..., C−ΔΔ, C, C+Δ, ..., C+(M−1)Δ, and C+MΔ, and generates (2M+1) pieces of output data D−MΔ, D−(M−1)Δ, ..., D−ΔΔ, D, D+Δ, ..., D+(M−1)Δ, and D+MΔ. The data detecting unit 330 may generate the (2M+1) pieces of output data D−MΔ, D−(M−1)Δ, ..., D−ΔΔ, D, D+Δ, ..., D+(M−1)Δ, and D+MΔ by detecting values of the (2M+1) pieces of delay data D-DELAY in response to the (2M+1) delay clock signals C−MΔ, C−(M−1)Δ, ..., C−Δ, C, C+Δ, ..., C+(M−1)Δ, and C+MΔ. Here, the data detecting unit 330 may include(2M+1) detecting units 331 through 337 that generate the (2M+1) pieces of output data D−MΔ, D−(M−1)Δ, ..., D−ΔΔ, D, D+Δ, ..., D+(M−1)Δ, and D+MΔ. Each of the (2M+1) detecting units 331 through 337 may be a D-type flip-flop, as illustrated in FIG. 5. However, the (2M+1) detecting units 331 through 337 are not limited thereto.

The comparing/selecting unit 340 receives the (2M+1) pieces of output data D−MΔ, D−(M−1)Δ, ..., D−Δ, D, D+Δ, ..., D+(M−1)Δ, and D+MΔ and outputs clock skew control signals CSC and detected values D−DATA. For example, the comparing/selecting unit 340 compares logic values of the output data D−MΔ, D−(m−1)Δ, ..., D−Δ, D, D+Δ, ..., D+(m−1)Δ, and D+MΔ, which are generated by the data detecting unit 330, and generates the clock skew control signals CSC and the detected data D_DATA, which are used for controlling phases of the clock signal CLOCK.

A number of the output data having a logic high value (1) and a number of the output data having a logic low value (0) from among the (2M+1) pieces of output data D−MΔ, D−(M−1)Δ, ..., D−Δ, D, D+Δ, ..., D+(M−1)Δ, and D+MΔ may be compared, and the clock skew control signals CSC may be determined to adjust the phase of the clock signal CLOCK. The phase of the clock signal CLOCK may be adjusted using a median delay time from among the plurality of delay times that are applied to the delay clock signals to generate output data having a logic value corresponding to the dominant number of the output data, as determined in the above comparison.

The detected data D_DATA has the logic value corresponding to the dominant number of the output data, as determined in the above comparison. For example, if the number of the output data having the logic high value (1) is greater than the number of the output data having the logic low value (0), the detected data D_DATA has the logic high value (1). If the number of the output data having the logic low value (0) is greater than the number of the output data having the logic high value (1), the detected data D_DATA has the logic low value (0).

Here, the period of time N may be a random preset period of time, M is a natural number, and MΔ is greater than 0 and smaller than half of the period T of the clock signal CLOCK.

Figure 6:
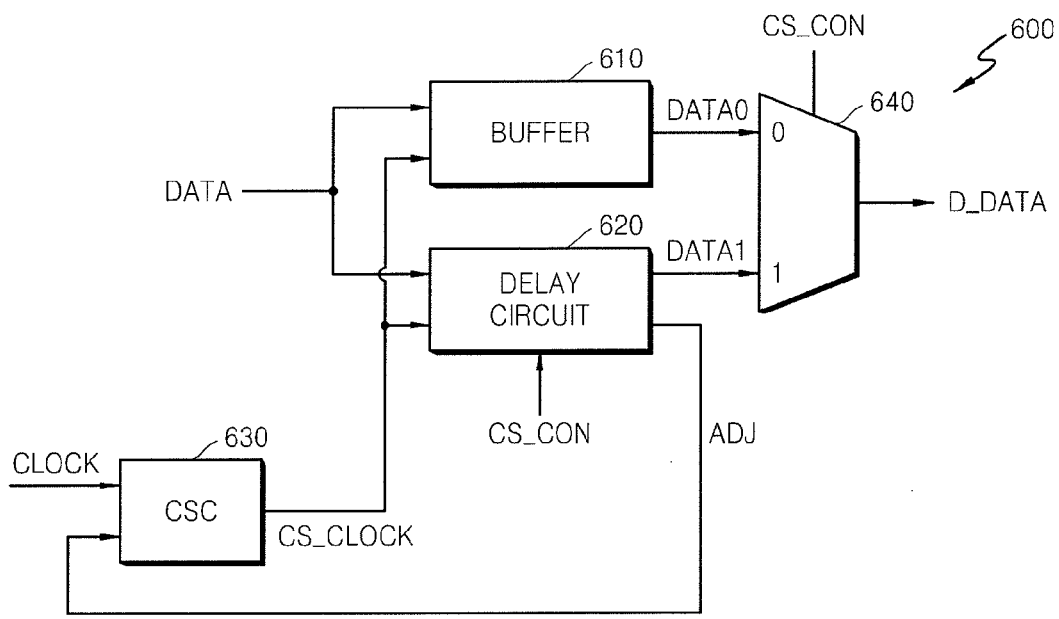
FIG. 6 shows an input/output system, according to an exemplary embodiment of the inventive concept.

FIG. 6 shows an input/output system 600, according to an exemplary embodiment of the inventive concept.

Referring to FIG. 6, the input/output system 600 according to an exemplary embodiment includes a buffer 610, a delay circuit 620, a skew compensating circuit 630, and a selecting unit 640.

The buffer 610 receives the data DATA and a compensated clock signal CS_CLOCK, detects the data DATA by using the compensated clock signal CS_CLOCK, and generates normally detected data DATA0.

The delay circuit 620 receives the data DATA and the compensated clock signal CS_CLOCK and generates compensated detected data DATA1. The delay circuit 620 may further receive a clock skew control signal CS_CON. The delay circuit 620 generates (2M+1) pieces of equal delay data that are generated by delaying the data DATA by the default delay time (e.g., the period of time N), detects values of each piece of the delay data by using the (2M+1) delay clock signals C−MΔ, C−(m−1)Δ, ..., C−Δ, C, C+Δ, ..., C+(m−1)Δ, and C+MΔ generated by delaying the compensated clock signal CS_CLOCK by the period of time N and periods of time (N±mΔ), and generates the (2M+1) pieces of output data. Logic values of the (2M+1) pieces of output data are compared, the compensated detected data DATA1 having the logic value corresponding to the dominant number of the output data as determined in the above comparison is generated, and an adjusting signal ADJ used for adjusting the phase of the compensated clock signal CS_CLOCK is generated.

The delay circuit 620 may include the function blocks shown in FIG. 3, including the data delaying unit 310, the clock delaying unit 320, the data detecting unit 330, and the comparing/selecting unit 340.

The data delaying unit 310 generates the (2M+1) pieces of delay data by delaying the data DATA by the default delay time (e.g., the period of time N).

The clock delaying unit 320 receives the compensated clock signal CS_CLOCK having the period T and generates the (2M+1) delay clock signals C−MΔ, C−(M−1)Δ, ..., C−Δ, C, C+Δ, ..., C+(M−1)Δ, and C+MΔ by delaying the compensated clock signal CS_CLOCK by the period of time N and the periods of time (N±mΔ). Here, m is a natural number from 1 to M. The clock delaying unit 320 may include the (2M+1) delaying units 321 through 327, which are connected in series and generate the (2M+1) delay clock signals C−MΔ, C−(M−1)Δ, ..., C−Δ, C, C+Δ, ..., C+(M−1)Δ, and C+MΔ by delaying the phases of the compensated clock signal CS_CLOCK by multiples of the unit delay time Δ. The (2M+1) delaying units 321 through 327 may be two inverters that are connected to each other in series. However, the (2M+1) delaying units 321 through 327 are not limited thereto. In this case, the default delay time (e.g., the period of time N) may be equal to the unit delay time Δ multiplied by (M+1).

The data detecting unit 330 detects the (2M+1) pieces of delay data D-DELAY by using the (2M+1) delay clock signals C−MΔ, C−(M−1)Δ, ..., C−Δ, C, C+Δ, ..., C+(M−1)Δ, and C+MΔ, and generates the (2M+1) pieces of output data D−MΔ, D−(M−1)Δ, ..., D−Δ, D, D+Δ, ..., D+(M−1)Δ, and D+MΔ. The data detecting unit 330 may include the (2M+1) detecting units 331 through 337, which detect the values of each of the (2M+1) pieces of delay data respectively in response to the (2M+1) delay clock signals C−MΔ, C−(M−1)Δ, ..., C−Δ, C, C+Δ, ..., C+(M−1)Δ, and C+MΔ, and generate the (2M+1) pieces of output data D−MΔ, D−(M−1)Δ, ..., D−Δ, D, D+Δ, ..., D+(M−1)Δ, and D+MΔ. The (2M+1) detecting units 331 through 337 may be D-type flip-flops as shown in FIG. 5, however, the (2M+1) detecting units 331 through 337 are not limited thereto.

The comparing/selecting unit 340 compares logic values of the output data D−MΔ, D−(M−1)Δ, ..., D−Δ, D, D+Δ, ..., D+(M−1)Δ, and D+MΔ generated by the data detecting unit 330, and generates the adjusting signal ADJ and the compensated detected data DATA1. A number of the output data having a logic high value (1) and a number of the output data having a logic low value (0) from among the (2M+1) pieces of output data D−−MΔ, D−(M−1)Δ, ..., D−A, D, D+Δ, ..., D+(M−1)Δ, and D+MΔ may be compared. Once the logic values are compared, the adjusting signal ADJ may be determined to adjust the phase of the clock signal CLOCK using a median delay time from among the delay times applied to the delay clock signals that are used to generate the output data having a logic value corresponding to the dominant number of the output data, as determined in the above comparison. The compensated detected data DATA1 has the logic value corresponding to the dominant number of the output data as determined in the above comparison.

The skew compensating circuit 630 receives the clock signal CLOCK and the adjusting signal ADJ, and generates the compensated clock signal CS_CLOCK. For example, the skew compensating circuit 630 generates the compensated clock signal CS_CLOCK by adjusting the phase of a received clock signal CLOCK in response to the adjusting signal ADJ.

The selecting unit 640 selects one of the normal detected data DATA0 and the compensated detected data DATA1, and outputs the selected data as the final detected data D_DATA, in response to a clock skew control signal CS_CON.

The input/output system 600 may control the phase of the compensated clock signal CS_CLOCK at a predetermined interval, or although not shown in FIG. 6, in response to predetermined control signals after a system is initialized.

For example, the delay circuit 620 may include a predetermined timer (not shown), which may be used to adjust the phase of the compensated clock signal CS_CLOCK by generating the adjusting signal ADJ at a predetermined interval. Alternatively, as shown in FIG. 6, the phase of the compensated clock signal CS_CLOCK may be controlled using the clock skew control signal CS_CON output by a control device (not shown). In this case, the clock skew control signal CS_CON may be used for controlling both the delay circuit 620 and the selecting unit 640.

Although not shown in FIG. 6, an exemplary embodiment of the inventive concept may be applied to received data transmitted in parallel, rather than received data DATA transmitted in serial. Further, the input/output system shown in FIG. 6 may be applied to a system for recovering received data, and may also be applied to a reception unit of a system for converting received serial data into parallel data or vice versa.

Since it is necessary for the timings of data and a clock used for recovering the data to be synchronized, a skew between a clock and data is generally minimized through a training operation when a system is booted.

For example, random data is stored in a memory device by using a low frequency clock signal, and the data is read by using a clock signal having a relatively fast frequency as compared to the clock signal used to store the data. Here, the relatively fast frequency may refer to a frequency used by a system for transmitting/receiving data. Data in the memory device may be read by fixing a frequency of a clock signal and changing the phase of the clock signal. Once it is determined that the data read from a memory device is identical to the data actually stored in the memory device, the median phase from among the corresponding phases is set as the phase of the clock signal.

However, according to the above method, it may be necessary to reboot a system when a skew occurs between a clock and data due to, for example, changes in the surrounding environment during operation of the system. According to an exemplary embodiment of the inventive concept, this skew may be minimized by monitoring operation of the system and adjusting the phase of a clock signal at a predetermined interval, similar to refreshing a dynamic memory. Thus, it may not be necessary to reboot a system for adjusting the phase of a clock signal.

Adjusted phases may be adaptively selected based on the purpose of an input/output system and the frequency of a clock signal (e.g., based on the design of the input/output system).

Figure 7:
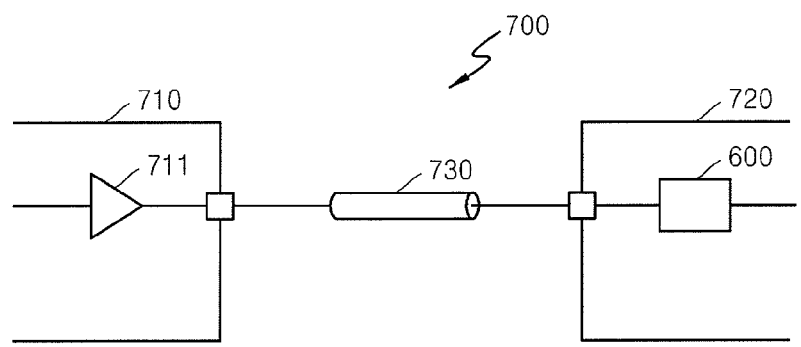
FIG. 7 shows a data transmission/reception system, according to an exemplary embodiment of the inventive concept.

FIG. 7 shows a data transmission/reception system, according to an exemplary embodiment of the present inventive concept.

Referring to FIG. 7, an input/output system according to an exemplary embodiment of the inventive concept may be applied to a reception unit 600 of a reception system 720. In the case of a data transmission/reception system 700, a transmission system 710 transmits data, and a clock signal is used for receiving the data at the reception unit 600 of the reception system 720 simultaneously via an output buffer 711 and a transmission path 730.

While the inventive concept has been particularly shown and described with reference to the exemplary embodiments thereof, it will be understood by those of ordinary skill in the art that various changes in form and detail may be made therein without departing from the spirit and scope of the inventive concept as defined by the following claims.

What is claimed is:

1. A method of compensating a clock skew, comprising:
generating (2M+1) detected values by applying (2M+1) delay clock signals to (2M+1) pieces of delay data, wherein M is a natural number;
determining a dominant logic value based on a comparison of a number of logic high detected values and a number of logic low detected values from among the (2M+1) detected values;
determining a median delay time based on a number of the (2M+1) detected values having the dominant logic value; and
generating a clock skew control signal based on the median delay time, wherein the clock skew control signal controls a phase of a clock signal.

2. The method of claim 1, further comprising:
generating the (2M+1) pieces of delay data by delaying received data by a predetermined default delay time; and
generating the (2M+1) delay clock signals by delaying the clock signal by a plurality of delay times including the default delay time.

3. The method of claim 1, wherein the clock skew is compensated in real-time.

4. The method of claim 1, wherein the clock skew is compensated automatically at a predetermined interval during an operation of a system, or the clock skew is compensated in response to a predetermined control signal after the system has been initialized.

5. A clock skew compensating circuit, comprising:
a data delaying unit configured to generate (2M+1) pieces of delay data by delaying a phase of received data by a period of time N, wherein the (2M+1) pieces of delay data have a same phase, N is a predetermined period of time, and M is a natural number;

a clock delaying unit configured to generate (2M+1) delay clock signals by delaying a clock signal having a period T by delay times including periods of time (N±mΔ), wherein m is a natural number greater than or equal to 1 and less than or equal to M, and Δ is a unit delay time greater than or equal to 0 and less than or equal to T/(2M);

a data detecting unit configured to generate (2M+1) pieces of output data by applying the (2M+1) delay clock signals to the (2M+1) pieces of delay data; and a comparing/selecting unit configured to generate a clock skew control signal and detected data, wherein the clock skew control signal and the detected data are generated based on a comparison of logic values of the (2M+1) pieces of output data, and control a phase of the clock signal.

6. The clock skew compensating circuit of claim 5, wherein the clock delaying unit comprises (2M+1) delaying units connected in series and configured to generate the (2M+1) delay clock signals by delaying a phase of the clock signal by the unit delay Δ (2M+1) times.

7. The clock skew compensating circuit of claim 5, wherein the data detecting unit comprises (2M+1) detecting units configured to output the (2M+1) pieces of output data by applying the (2M+1) delay clock signals to the (2M+1) pieces of delay data.

8. The clock skew compensating circuit of claim 7, wherein each of the (2M+1) detecting units is a D-type flip-flop.

9. The clock skew compensating circuit of claim 5, wherein the clock skew control signal is determined by comparing a number of output data having a logic high value and a number of output data having a logic low value from among the (2M+1) pieces of output data, and adjusting a phase of the clock signal using a median delay time among the delay times applied to the delay clock signals, wherein the median delay time is based on the number of output data having the logic high value upon determining that the logic high value is dominant, or the number of output data having the logic low value upon determining that the logic low value is dominant, wherein the detected data has a logic value corresponding to the dominant logic value.

10. The clock skew compensating circuit of claim 5, wherein the period of time N is equal to the unit delay time Δ multiplied by (M+).

11. An input/output system, comprising:

a buffer configured to generate normally detected data by applying a compensated clock signal having a period T to received data;

a delay circuit configured to:
generate (2M+1) pieces of delay data by delaying the received data by a period of time N, wherein M is a natural number, and N is a predetermined period of time, generate (2M+1) pieces of output data by applying (2M+1) delay clock signals generated by delaying the compensated clock signal by periods of time (N±mΔ) to the (2M+1) pieces of delay data, wherein m is a natural number greater than or equal to 1 and less than or equal to M, and Δ is a unit delay time greater than or equal to 0 and less than or equal to T/(2M), compare logic values of the (2M+1) pieces of output data, generate compensated detected data having a logic value corresponding to a dominant logic number of the (2M+1) pieces of output data, and generate an adjusting signal based on a comparison of the logic values of the (2M+1) pieces of output data, wherein the adjusting signal adjusts a phase of the compensated clock signal;

a skew compensating circuit configured to generate the compensated clock signal by adjusting a phase of a received clock signal in response to the adjusting signal; and a selecting unit configured to select one of the normally detected data and the compensated detected data, and output the selected data in response to a clock skew control signal.

12. The input/output system of claim 11, wherein the delay circuit comprises:

a data delaying unit configured to generate the (2M+1) pieces of delay data by delaying a phase of the received data by the period of time N, wherein the (2M+1) pieces of delay data have a same phase;

a clock delaying unit configured to generate the (2M+1) delay clock signals by delaying the compensated clock signal by delay times including periods of time (N±mΔ);

a data detecting unit configured to generate the (2M+1) pieces of output data by applying the (2M+1) delay clock signals to the (2M+1) pieces of delay data; and a comparing/selecting unit configured to compare logic values of the (2M+1) pieces of output data and generate the adjusting signal and the compensated detected data.

13. The input/output system of claim 12, wherein the clock delaying unit comprises (2M+1) delaying units connected in series and configured to generate the (2M+1) delay clock signals by delaying the phase of the compensated clock signal by a unit delay time Δ (2M+1) times.

14. The input/output system of claim 12, wherein the data detecting unit comprises (2M+1) detecting units configured to receive the (2M+1) pieces of delay data and output the (2M+1) pieces of output data by applying the (2M+1) delay clock signals to the (2M+1) pieces of delay data.

15. The input/output system of claim 14, wherein each of the (2M+1) detecting units is a D-type flip-flop.

16. The input/output system of claim 11, wherein the adjusting signal is determined by comparing a number of output data having a logic high value and a number of output data having a logic low value from among the (2M+1) pieces of output data, and the delay circuit is configured to adjust the phase of the compensated clock signal using a median delay time among the delay times applied to the delay clock signals, wherein the median delay time is based on the number of output data having the logic high value upon determining that the logic high value is dominant, or the number of output data having the logic low value upon determining that the logic low value is dominant.

17. The input/output system of claim 11, wherein a skew of the compensated clock signal is automatically adjusted at a predetermined interval upon initializing the input/output system, or the skew of the compensated clock signal is adjusted in response to a predetermined control signal output by a main control device of the input/output system.

18. The input/output system of claim 17, wherein the delay circuit further comprises a timer configured to control an operation of the delay circuit.

19. The input/output system of claim 17, wherein the clock skew control signal is configured to control an operation of the delay circuit.

20. The input/output system of claim 11, wherein the input/output system is included in a reception unit of a system configured to convert received serial data into parallel data, or convert received parallel data into serial data.

* * * * *